United States Patent [19]

Matsumoto

[11] Patent Number: 5,568,201
[45] Date of Patent: Oct. 22, 1996

[54] CLOCK SIGNAL GENERATING APPARATUS

[75] Inventor: Hiroaki Matsumoto, Chiba, Japan

[73] Assignee: Sony Corporation, Tokyo, Japan

[21] Appl. No.: 341,995

[22] Filed: Nov. 16, 1994

[30] Foreign Application Priority Data

Nov. 24, 1993 [JP] Japan .................................. 5-317427

[51] Int. Cl.⁶ ..................................... H04N 5/04
[52] U.S. Cl. ......................... 348/500; 348/537; 348/540
[58] Field of Search ..................................... 348/500, 537, 348/441, 540, 537, 505, 497, 527; 375/376; 331/10, 2, 18, 25; 358/335, 326, 323; 327/159; H04N 6/04, 5/04

[56] References Cited

U.S. PATENT DOCUMENTS

| | | | |
|---|---|---|---|
| 4,775,890 | 10/1988 | Balaban et al. | 358/148 |
| 5,124,671 | 6/1992 | Srivastava | 331/10 |
| 5,170,297 | 12/1992 | Wahler et al. | 375/374 |
| 5,184,091 | 2/1993 | Srivasatava | 331/10 |
| 5,214,677 | 5/1993 | Mori | 375/376 |
| 5,259,007 | 11/1993 | Yamamoto | 375/376 |
| 5,278,702 | 1/1994 | Wilson et al. | 375/376 |
| 5,414,741 | 5/1995 | Johnson | 375/376 |

Primary Examiner—John K. Peng
Assistant Examiner—Nina M. West
Attorney, Agent, or Firm—William S. Frommer; Alvin Sinderbrand

[57] ABSTRACT

An apparatus for generating a clock signal phase-locked to a sync signal of a video signal. The apparatus comprises an error detector for detecting a phase error between the sync signal of the digitized video signal and a comparison signal produced internally; a clock signal generator whose oscillation frequency is variably controlled in response to the output of the error detector; a counter for counting the output of the clock signal generator; and a circuit for producing the comparison signal in response to the count value of the counter. The phase error is detected by integrating the level data of the digitized video signal, and the output of the error detector is replaced with a fixed value when the comparison signal has a predetermined phase. The apparatus is capable of preventing occurrence of a great phase error even at a head switching time or during the vertical blanking interval, so that mislock is preventable and a pull-in action can be executed fast.

13 Claims, 11 Drawing Sheets

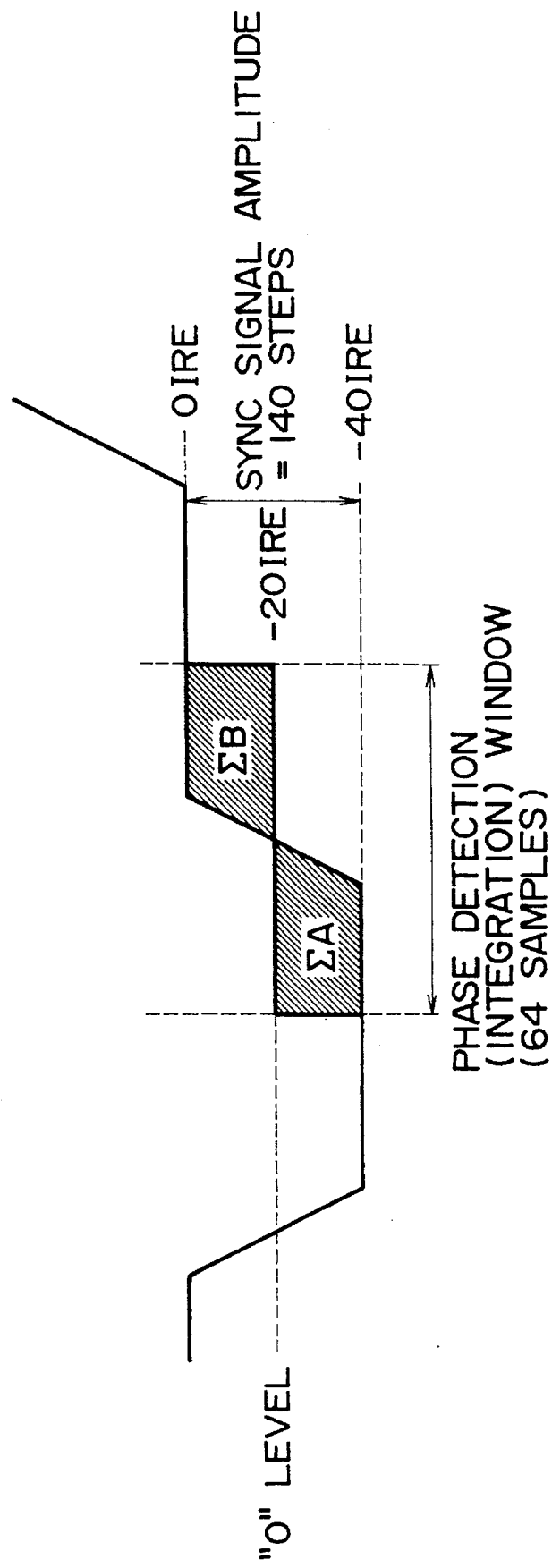

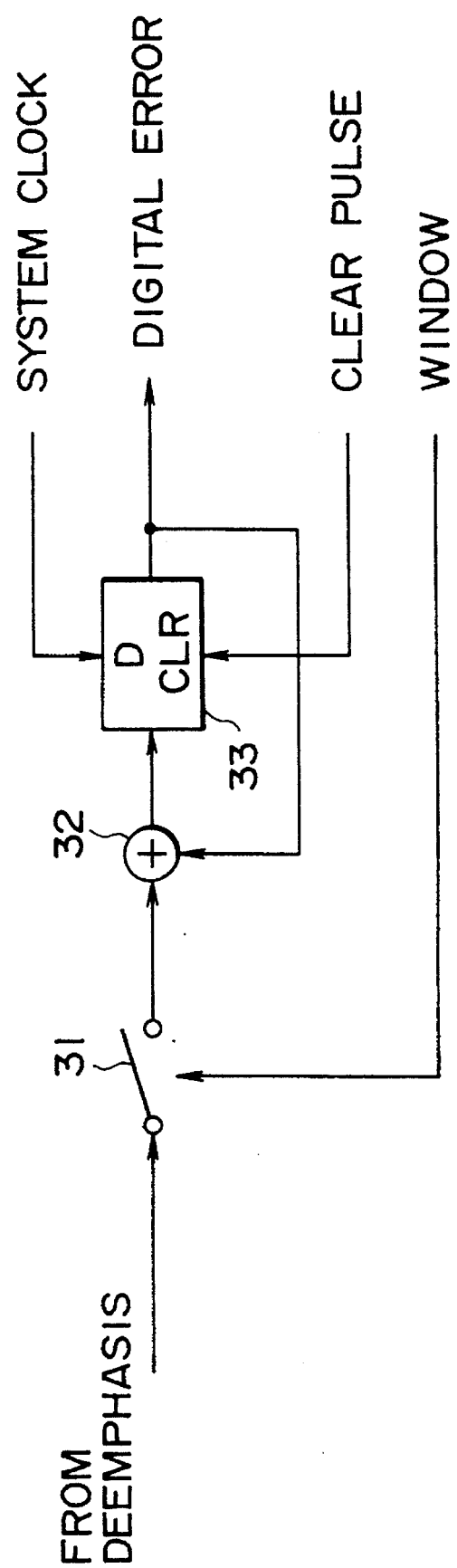

CLOCK SIGNAL GENERATING APPARATUS

BACKGROUND OF THE INVENTION

The present invention relates to a clock signal generating apparatus for use in a system where a video signal is digitally processed.

There are known video tape recorders (VTRs) each furnished with a digitized video signal processing circuit, such as the one disclosed in "Electronics Life", July 1988, pp. 47–53.

FIG. 11 is a block diagram showing an exemplary configuration of a reproduced video signal processing circuit employed in one conventional VTR of the type mentioned. In this diagram, a composite signal, which is obtained by mixing a low-frequency converted C signal with an FM-Y signal reproduced from a magnetic tape (not shown) by a reproducing head 1, is amplified by a head amplifier 2. Subsequently the FM-Y signal is separated by a high pass filter 3 and then is supplied to an A-D converter 4. Meanwhile the low-frequency converted C signal is separated by a low pass filter (not shown) and then is supplied to a reproduced color signal processing circuit (not shown). Since the present invention is not concerned directly with the C signal processing system, no description will be given below with regard to the color signal processing circuit. The FM-Y signal inputted to the A-D converter 4 is digitized therein and is supplied to an FM demodulator 5, where the digitized FM-Y signal is demodulated to become a digital Y signal. This Y signal is deemphasized by a next deemphasis circuit 6 in the next stage, and the Y signal thus processed is supplied to a sharpness circuit 7 where the sharpness thereof is adjusted. And after correction of the time base in a TBC 8, its output is supplied to a D-A converter (not shown) where the Y signal is converted into an analog signal.

In the Y signal reproducing system thus constituted, the A-D converter 4 and the FM demodulator 5 use a clock signal whose frequency is double that of a system clock signal having a 910-fold higher frequency (hereinafter referred to as 910fH) in comparison with a horizontal sync signal. Meanwhile the sharpness circuit 7 and the TBC 8 use the system clock signal of the frequency 910fH. This system clock signal is generated by first converting the output of the deemphasis circuit 6 into an analog Y signal by the D-A converter 9, then separating a horizontal sync signal from the analog Y signal by a horizontal sync separator 10, and supplying the horizontal sync signal to a PLL circuit 11. The PLL circuit 11 comprises a phase comparator 12 for comparing the phase of the horizontal sync signal with that of an internal comparison signal, a low pass filter 13, a VCO 14 for generating a system clock signal of the frequency 910fH, a 1/910 counter 15 which counts the output of the VCO 14 and is reset upon arrival of the counted value at 910, and a comparison signal generator 16 for generating a comparison signal of rectangular or similar waves from the counted value of the 1/910 counter 15 and supplying the comparison signal to the phase comparator 12.

However, in the conventional VTR mentioned above, there exists a disadvantage that an additional D-A converter is required for once converting the digitized Y signal into an analog signal to produce a clock signal used in the digital processing system.

Furthermore, due to occurrence of a great phase error resulting from some skew at a head switching time or variations of the horizontal sync signal period in the vertical blanking interval, there arises another problem that the operation is rendered unstable in an upper portion and so forth of the screen.

OBJECTS AND SUMMARY OF THE INVENTION

In an attempt to solve the problems described above, it is an object of the present invention to provide a clock signal generating apparatus wherein phase data of a horizontal sync signal is extracted directly from a digitized Y signal.

And another object of the invention resides in providing a clock signal generating apparatus which is capable of preventing occurrence of a great phase error even at a head switching time or during the vertical blanking interval.

According to one aspect of the present invention, there is provided an apparatus for generating a clock signal phase-locked to a sync signal in a composite video signal. The apparatus comprises an error detector means for detecting a phase error caused between a sync signal in a digitized video signal and a comparison signal produced in the apparatus, a clock signal generator means whose oscillation frequency is variably controlled by the output of the error detector means; a counter means for counting the output of the clock signal generator means; and a means for producing the comparison signal in response to the counted value of the counter means.

In the apparatus of the invention, the error detector means detects a phase error directly from a sync signal in a digitized video signal, and the clock signal generator means generates a clock signal whose oscillation frequency is variably controlled on the basis of such phase error.

The above and other features and advantages of the present invention will become apparent from the following description which will be given with reference to the illustrative accompanying drawings.

BRIEF DESCRIPTION OF THE DRAWINGS

FIG. 2 graphically shows the operation of a digital phase comparator;

FIG. 3 is a block diagram showing an exemplary circuit configuration of the digital phase comparator;

DESCRIPTION OF THE PREFERRED EMBODIMENTS

Hereinafter preferred embodiments of the present invention will be described in detail in the following order with reference to the accompanying drawings.
[1] Basic constitution of clock signal generating apparatus
[2] Operation and circuit configuration of digital phase comparator
[3] Conversion of digital phase error into analog form
[4] Selection of trailing edge and leading edge
[5] Prevention of mislock and speed up of pull-in action
[6] Means for dealing with discontinuity of sync signal

[1] Basic constitution of clock signal generating apparatus

Figure 1:
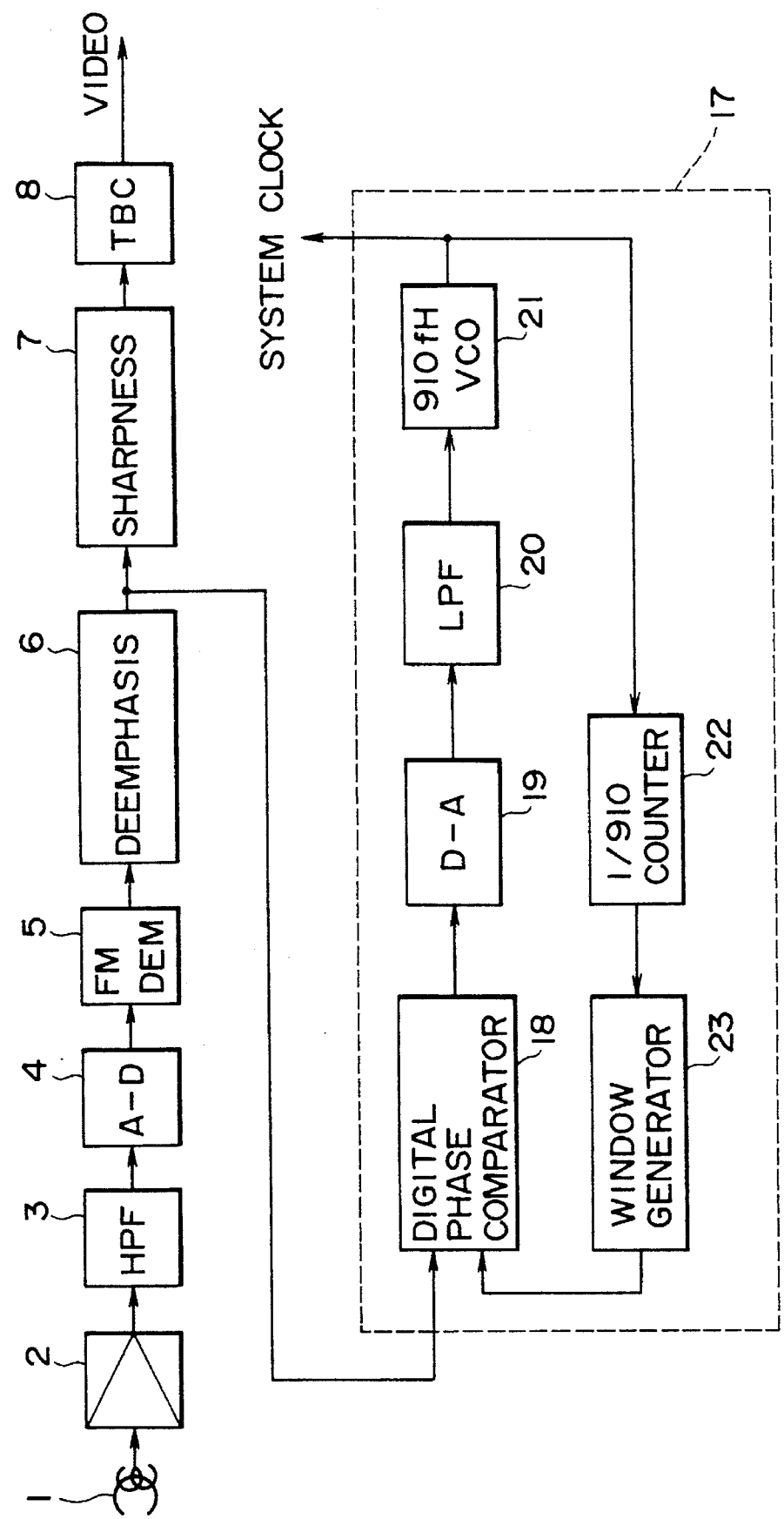
FIG. 1 is a block diagram showing a circuit configuration of a reproducing section in a VTR where the present invention is applied.

FIG. 1 is a block diagram showing a circuit configuration of a reproducing section in a VTR where the present invention is applied. Since a video signal processing section is the same as the aforementioned one in FIG. 11, a repeated explanation thereof is omitted here.

Figure 11:
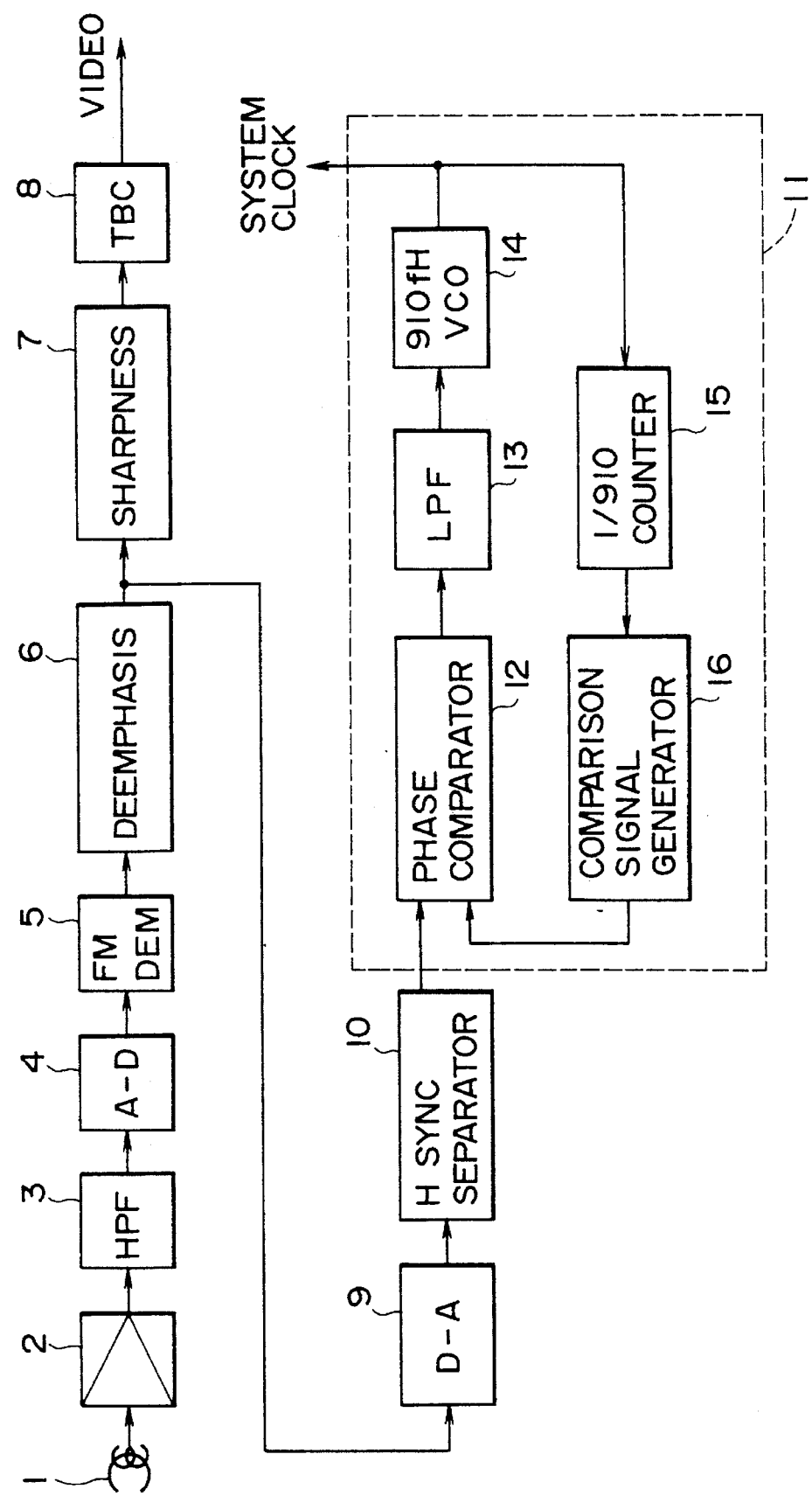
FIG. 11 is a block diagram of a conventional clock signal generating apparatus in a known VTR.

In this VTR, the apparatus for generating a clock signal is different in constitution from the conventional example shown in FIG. 11. More specifically, in this embodiment, a digital Y signal outputted from a deemphasis circuit 6 is supplied directly to a PLL circuit 17.

The PLL circuit 17 comprises a digital phase comparator 18, a D-A converter 19, a low pass filter 20, a VCO 21, a 1/910 counter 22 and a window generator 23. In this embodiment, the low pass filter 20, the VCO 21 and the 1/910 counter 22 are fundamentally the same as the aforementioned low pass filter 13, VCO 14 and 1/910 counter 15 in the conventional example of FIG. 11.

[2] Operation and circuit configuration of digital phase comparator

As shown in FIG. 2 for example, the digital phase comparator 18 extracts, during a period in which a window generated by the window generator 23 is open, 64 samples from anterior and posterior positions of the leading edge of the horizontal sync signal of the input Y signal by the use of a system clock signal, and detects the phase error between the horizontal sync signal and the window by adding the extracted samples. In the case of FIG. 2, a −20IRE level of the horizontal sync signal is so set as to correspond to a 0 level of a 10-bit digital signal, and −40IRE to 0IRE levels are quantized in 140 steps. And if the minus portion ΣA and the plus portion ΣB in the sum obtained by adding the sampled digital values are equal to each other, it signifies a proper phase lock point. Meanwhile, if ΣA<ΣB, the phase of the window is leading; whereas if ΣA>B, the phase of the window is lagging.

FIG. 3 shows an exemplary circuit configuration of the digital phase comparator 18. The digital Y signal outputted from the deemphasis circuit 6 in FIG. 1 is supplied via a switching circuit 31 to an adder 32. The switching circuit 31 is turned on or off under control of the window, whereby 64 samples in FIG. 2 are outputted therefrom successively to the adder 32.

The window for executing on/off control of the switching circuit 31 is generated by the window generator 23. The window generator 23 consists of a decoder for outputting an active signal during a period in which the count of the 1/910 counter 22 is a predetermined value (e.g., 1–64).

Since the adder 32 is so formed as to add the output of a latch circuit 33 and the output of the switching circuit 31, it follows that the adder 32 performs an operation of adding the preceding sample value and the current sample value 64 times successively. The result obtained by thus adding the 64 sample values is supplied as a digital phase error to a D-A converter 19 in the next stage. The latch circuit 33 is cleared per horizontal scanning period, and this embodiment is so formed that a clear pulse is outputted from the window signal generator 23 when the count of the 1/910 counter 22 has reached a predetermined value (e.g., 0). The clear pulse can be produced also out of the horizontal sync signal obtained from a digital sync separator which will be described later.

[3] Conversion of digital phase error into analog form

Figure 4A:
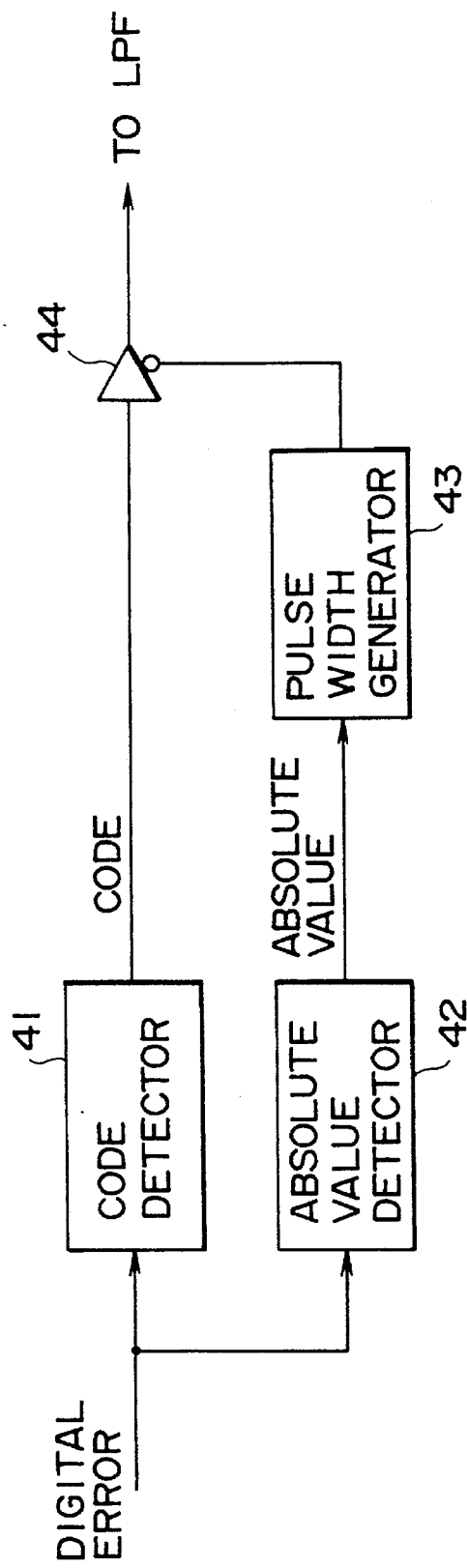
FIGS. 4a–4b shows an exemplary circuit for converting an error value of the digital phase comparator into a pulse width.
Figure 4B:
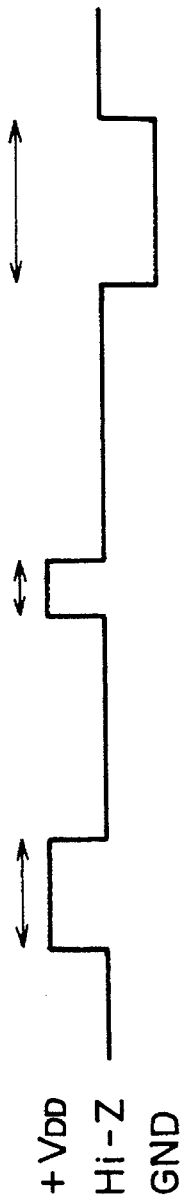

The required conversion rate of the D-A converter 19 may be so low as 15k samples/second or so. In another example, as shown in FIG. 4, the error value may be converted into a pulse width. In FIG. 4(a), a code detector 41 detects the code of a digital error and outputs the same to a tristate circuit 44. Meanwhile an absolute value detector 42 detects the absolute value of the digital error and outputs the same to a pulse width generator 43, where the absolute value of the digital error is converted into a pulse width and then is used to control the state of the tristate circuit 44. As a result, a signal shown in FIG. 4(b) is outputted from the tristate circuit 44.

Supposing now that the sync signal amplitude is divided into 140 steps and the window width is represented by 64 samples, the pulse width corresponding to the error value of the digital phase comparator 18 ranges from +4480 to −4480 which can be expressed by 14 bits. As compared therewith, in the circuit of FIG. 4, the expressible error value ranges merely from +910 to −910.

Figure 5:
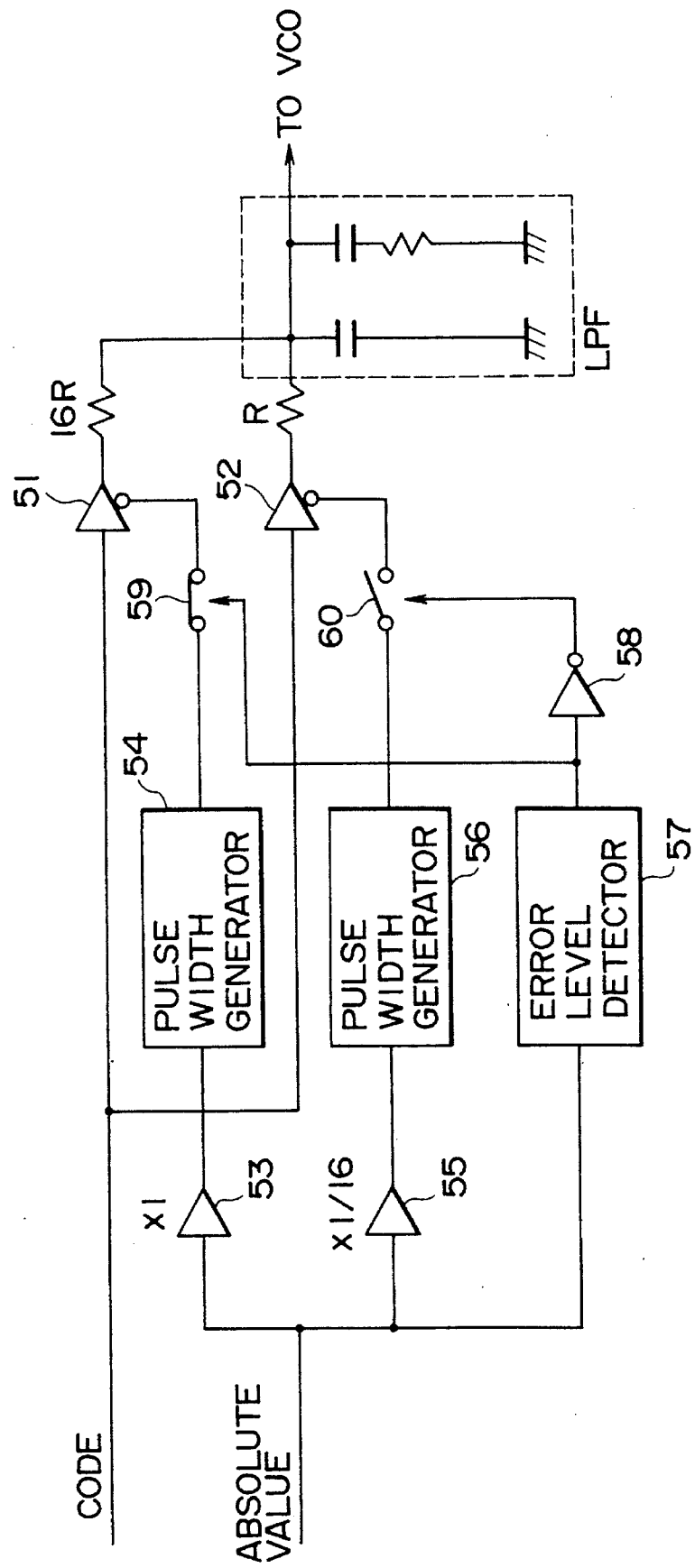
FIG. 5 shows an exemplary circuit for converting an error value into a pulse width, wherein both extension of a dynamic range and a high resolution can be compatibly achieved.

Therefore, as shown in FIG. 5, the absolute value of the digital error is divided into two lines; i.e., one line comprising a buffer 53 where the gain is set to 1→a pulse width generator 54→a switching circuit 59→a tristate circuit 51→a resistor having a resistance value 16R; and the other line comprising a buffer 55 where the gain is set to 1/16→a pulse width generator 56→a switching circuit 60→a tristate circuit 52→a resistor having a resistance value R. Then the absolute value of the digital error is detected by an error level detector 57, and a control action is so executed as to select the former line when the absolute value is smaller than 910, or to select the latter line when the absolute value is greater than 910. Consequently, the digital error of any absolute value smaller than 910 can be outputted with a high resolution, whereas with regard to the digital error of any value greater than 910, the linearity can be maintained although the resolution is somewhat lowered.

[4] Selection of trailing edge and leading edge

The clock signal generator described above detects the phase error by sampling the leading edge of the horizontal sync signal. When the leading edge of the horizontal sync signal is detected in this manner, the error waveform is rendered unstable during the vertical blanking period (hereinafter referred to as V BLK), although the content of the image is not affected. More specifically, during a 9-line interval including a vertical sync signal period in the V BLK and equalizing pulse periods anterior and posterior thereto, temporal continuity is existent in the trailing edge of the horizontal sync signal denoted by a solid line under the Y-signal waveform in FIG. 6, whereas such temporal continuity is not existent in the leading edge denoted by a dotted line. For this reason, high-level portions are sampled much during the equalizing pulses anterior and posterior to the vertical sync signal to thereby cause a gradual increase of the error value; while during the vertical sync signal period, low-level portions are sampled much to thereby cause a gradual decrease of the error value, hence varying the level of the error waveform during every vertical blanking period V BLK.

Figure 6:
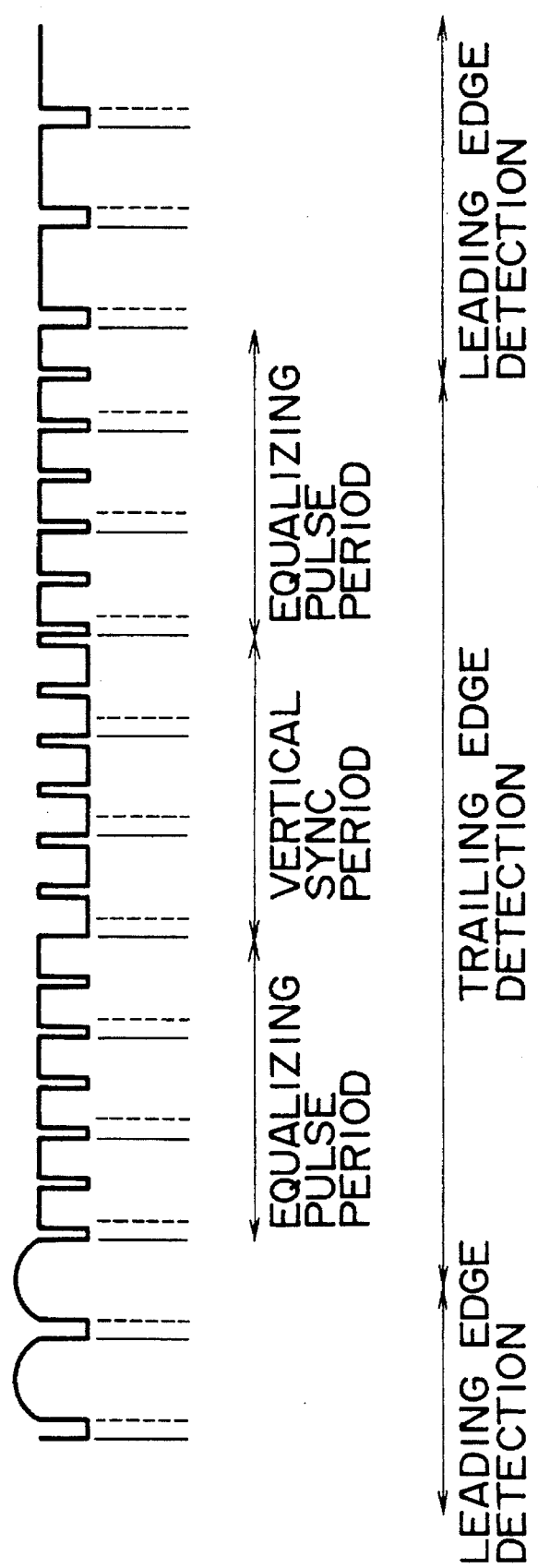
FIG. 6 graphically shows the relationship between the temporal continuity of edges of a horizontal sync signal in the vertical blanking period and the operation for detecting a phase error.

In order to eliminate the above problem, selective switching is performed to detect the leading edge of the horizontal sync signal during the aforementioned 9-line period as shown in FIG. 6, thereby preventing instability of the error waveform.

Figure 7:
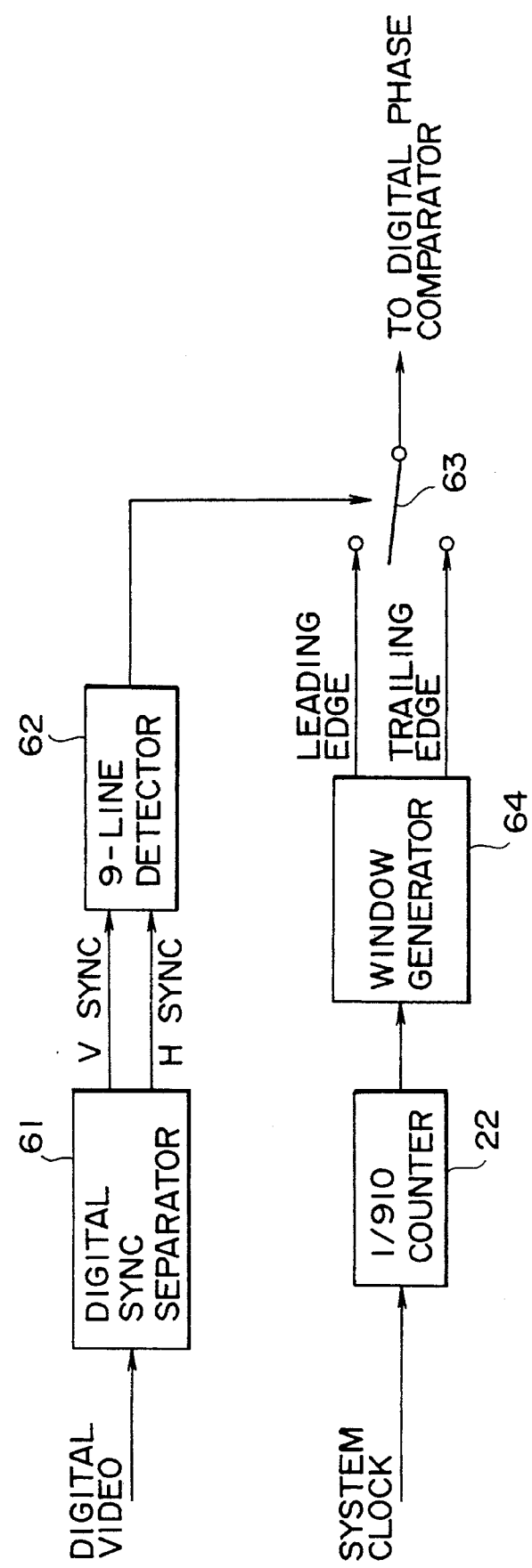
FIG. 7 shows an exemplary circuit configuration for realizing the operation performed in FIG. 6.

FIG. 7 shows an exemplary circuit configuration constructed for realizing such prevention. In this diagram, like circuit components corresponding to those shown in FIG. 1 are denoted by like reference numerals. In FIG. 7, the digital Y signal outputted from the deemphasis circuit 6 in FIG. 1 is supplied to a digital sync separator 61, where a horizontal sync signal and a vertical sync signal are separated and then are supplied to a 9-line detector 62. Subsequently the 9-line detector 62 counts the horizontal sync signal with reference to the vertical sync signal to thereby detect the 9-line period, hence controlling the on/off action of the switching circuit 63. Meanwhile a 1/910 counter 22 counts the system clock signal, and a window generator 64 decodes a predetermined count value to thereby generate a leading edge detection window and a trailing edge detection window. The leading edge detection window thus produced is the one shown in FIG. 2, while the trailing edge detection window is the one for extracting 64 samples from anterior and posterior positions of the trailing edge of the horizontal sync signal in FIG. 2. In the switching circuit 63, the leading edge detection window is selected during the 9-line period in the V BLK, or the trailing edge detection window is selected during any other period, and the selected window is supplied to the digital phase comparator.

[5] Prevention of mislock and speed up of pull-in action

Figure 8:
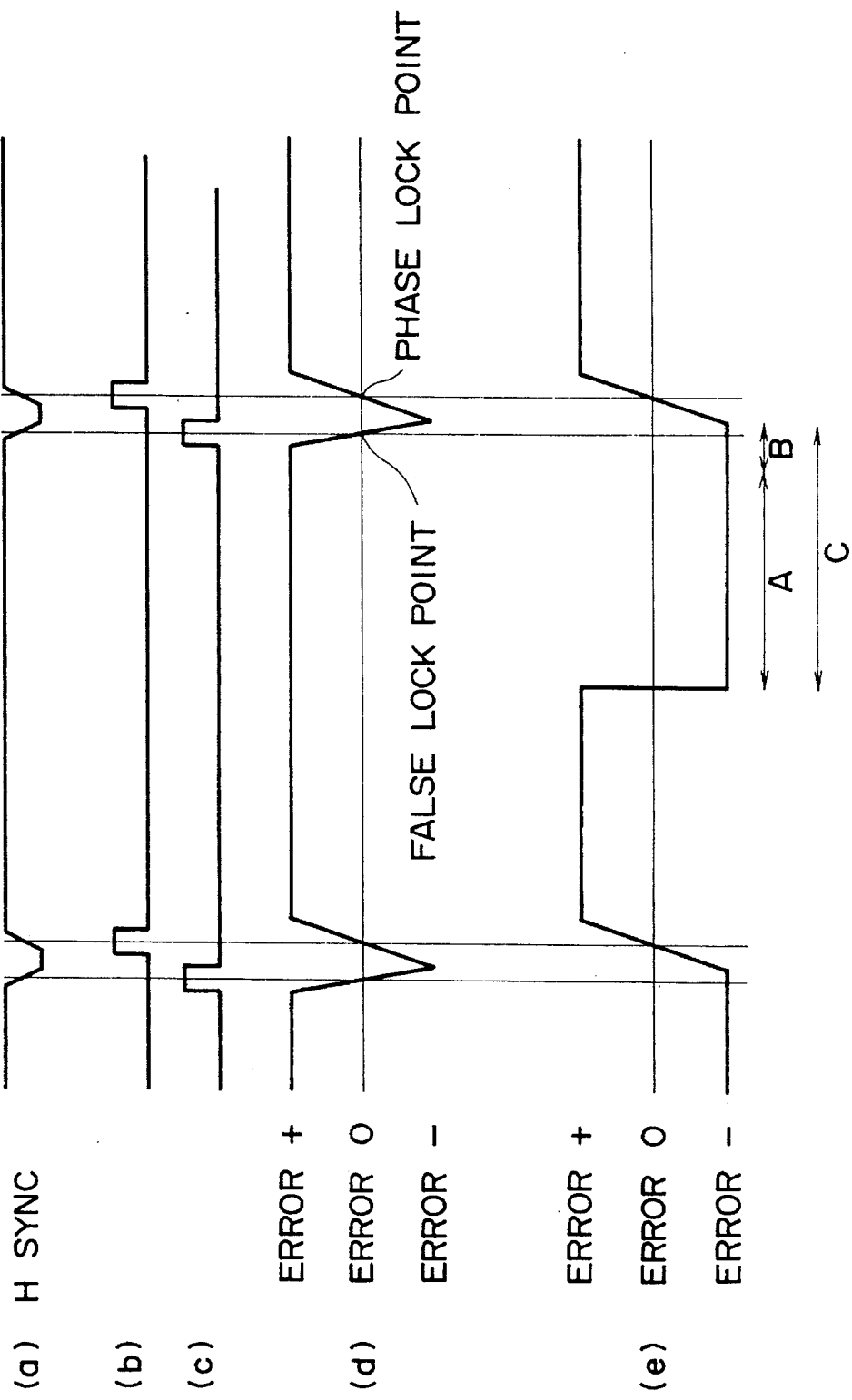
FIG. 8 graphically explains prevention of mislock and improvements in a pull-in action.
Figure 9:
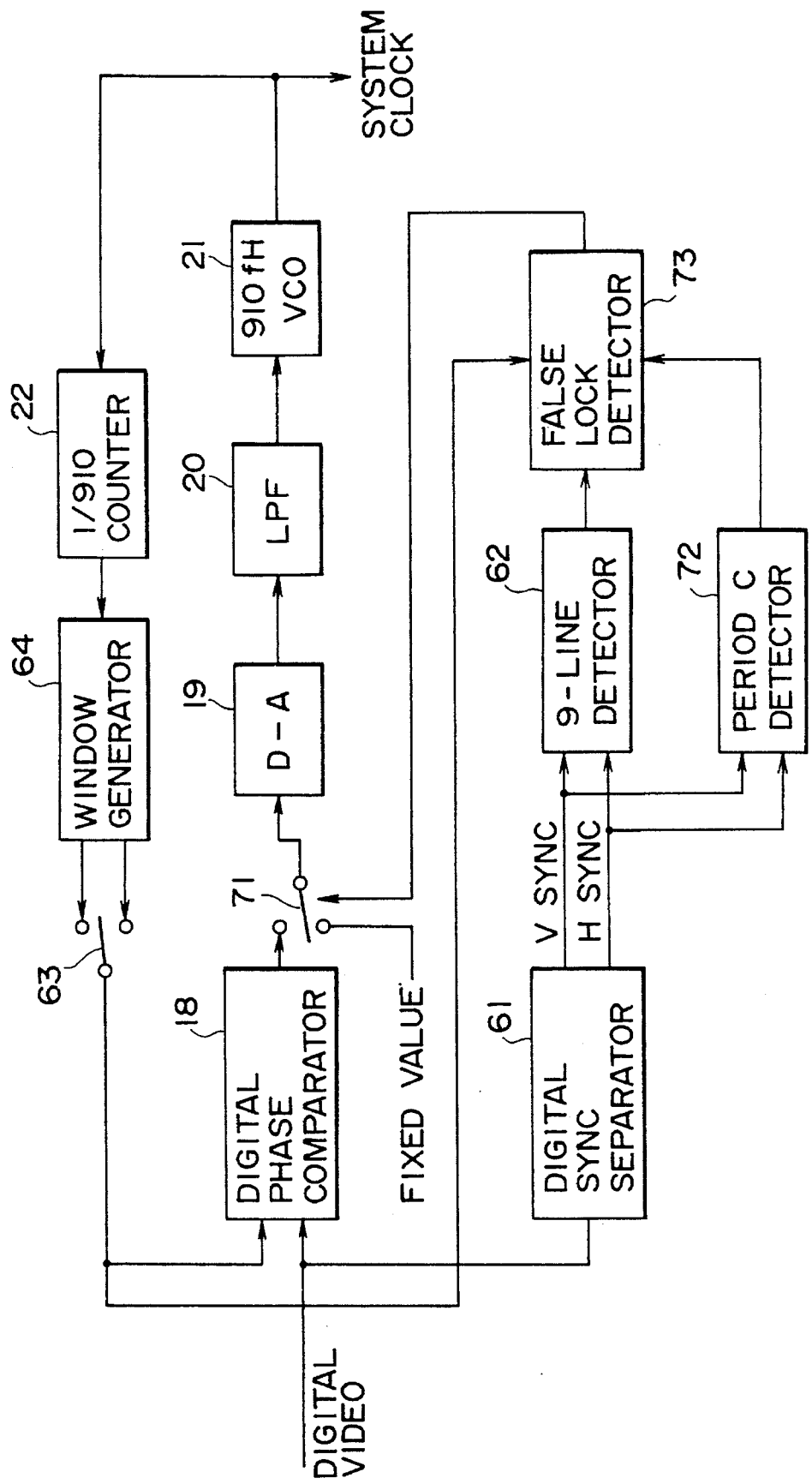
FIG. 9 shows an exemplary circuit configuration of a clock signal generating apparatus constructed to realize prevention of mislock and improvements in the pull-in action.

Referring now to FIGS. 8 and 9, a description will be given on a clock signal generating apparatus which is so constructed as to prevent mislock with another improvement of speeding up a pull-in action.

With regard to a horizontal sync signal (H SYNC) shown in (a) of FIG. 8, the window for detecting its leading edge is at the position of (b) of FIG. 8. At this time, the position satisfying the condition of ΣA=ΣB in FIG. 2 is a proper phase lock point. However, since the error value characteristic to the window position is such as shown in (d) of FIG. 8, there may occur mislock at the position shown in (c) of FIG. 8 with a disadvantage that the response speed in a pull-in action is lowered.

In order to solve the above problem, the apparatus is so devised that, when the window is within a period C (in (e) of FIG. 8) from an intermediate point of the horizontal scanning interval to the trailing edge of the horizontal sync signal, the error value is fixed at the maximum minus value, whereby the pull-in response characteristic is improved during a period A and mislock can be prevented during a period B.

FIG. 9 shows an exemplary circuit configuration for realizing the above improvements. In this diagram, like circuit components corresponding to those employed in FIG. 7 are denoted by like reference numerals. In FIG. 9, a switching circuit 71 is provided on the output side of a digital phase comparator 18. The switching circuit 71 elects a fixed value (maximum minus value) when the window is positioned within the period C in FIG. 8, or selects the output of the digital phase comparator 18 when the window is positioned in any other period.

In a digital sync separator 61, the horizontal sync signal and the vertical sync signal are separated from the digital Y signal for detection of the period C.

The sync signals thus separated are supplied to a 9-line detector 62 and a period C detector 72. The period C detector 72 counts the horizontal sync signal in accordance with the vertical sync signal to thereby produce an active signal in the period C and then supplies the same to a false lock detector 73. Subsequently, when the false lock detector 73 has detected that the window supplied from the window generator is present in the period C, the switching circuit 71 is so controlled as to be selectively changed to its fixed-value side. However, since a trailing edge is detected during the 9-line period in the V BLK as described with reference to FIGS. 6 and 7, there is performed a control operation in such a manner that the output of the 9-line detector 62 is supplied to the false lock detector 73 and the selective change to the fixed-value side is not executed during this period.

[6] Means for dealing with discontinuity of sync signal

Figure 10:
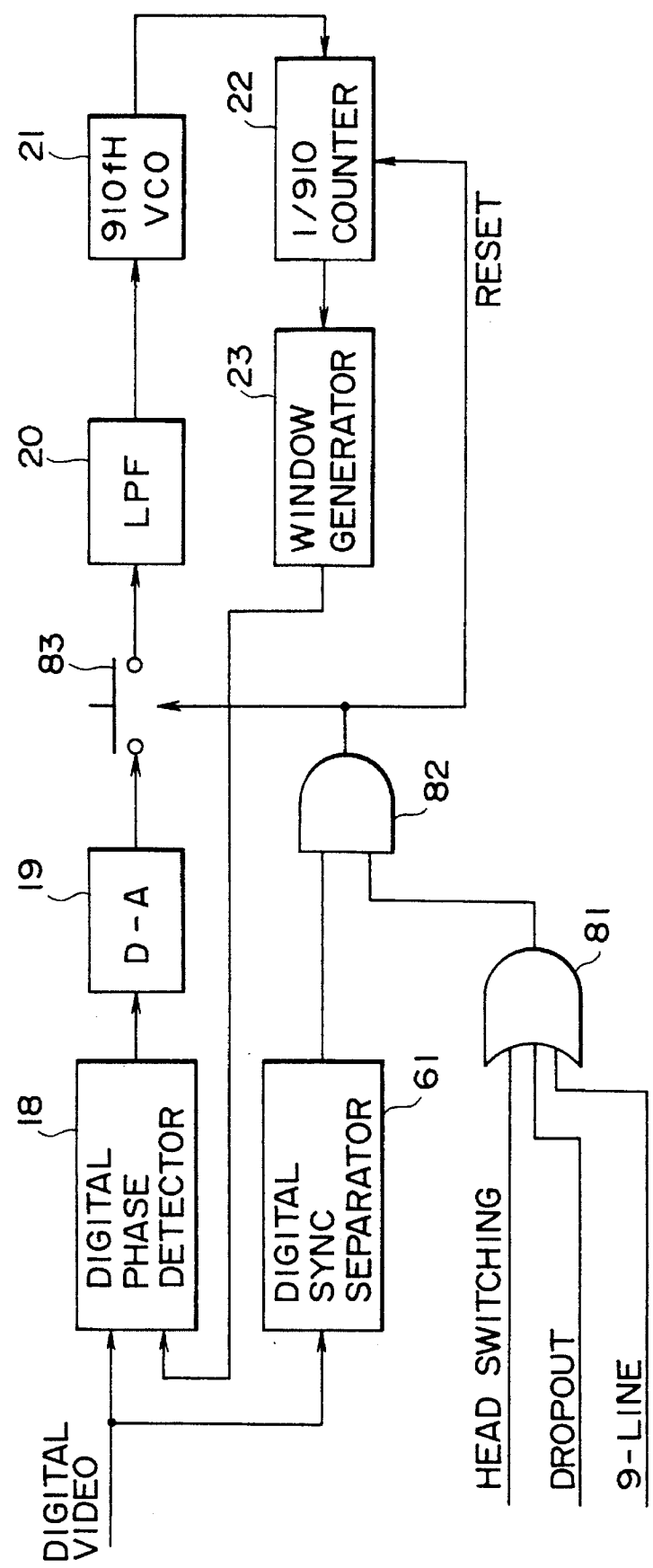
FIG. 10 is a block diagram showing a circuit configuration of a clock signal generating apparatus which is capable of performing a stable operation despite any temporal discontinuity of a sync signal.

Referring next to FIG. 10, a description will be given of a circuit configuration constructed to hold, at a head switching time, the preceding error without detecting any present error upon occurrence of a dropout or during the vertical blanking period V BLK.

At a head switching time, there exists no continuity in the horizontal sync signal intervals during a dropout or a 9-line period in the V BLK, so that a great error value is detected to consequently require a long time for the locking pull-in action. FIG. 10 shows an exemplary circuit configuration constructed for solving this problem, wherein a head switching signal, a dropout detection signal and a V BLK 9-line detection signal are inputted to an OR gate 81, then the output of the OR gate 81 and the horizontal sync signal separated by the digital sync separator 61 are inputted to an AND gate 82, and subsequently a switching circuit 83 is opened by the output of the AND gate 82 while the 1/910 counter 22 is reset, so that the operation is stabilized without detection of any great error value.

The preferred embodiments mentioned hereinabove with reference to FIGS. 6 to 10 are so constituted as to detect the trailing edges of merely 9 lines in the vertical blanking period V BLK. However, the circuit configuration may be so modified as to detect the trailing edges during the entire vertical blanking period as well.

Also in the embodiment of FIG. 9, the error value is fixed at the maximum minus value when the phase of the window is positioned within the period C which ranges from the intermediate point of the horizontal scanning period to the trailing edge of the horizontal sync signal. However, the period during which the error value is fixed at the maximum minus value may be changed to a period B only or (period B plus a rear portion of period A).

Furthermore, differing from the aforementioned embodiments applied to a reproducing section in a VTR where a composite video signal of a Y signal and a low-frequency converted C signal is recorded, the present invention is also applicable to, e.g., a Y-signal reproducing section in a VTR where a C signal and a Y signal are recorded on separate tracks individually.

Although in the above embodiments a digital error obtained from a digital phase comparator is once converted into an analog value and then is supplied to a low pass filter and a VCO, each of the low pass filter and the VCO may be composed of a digital circuit as well.

According to the present invention, as described hereinabove, a D-A converter is not necessary since required phase data is detected directly from a sync signal of a digital video signal.

In addition, due to an improved circuit configuration where a phase error is detected by integrating the level data of a digital video signal, it becomes possible to perform satisfactory detection of the phase error with a higher resolution in comparison with a system clock signal.

Furthermore, since the phase error is detected through selection of either a leading edge or a trailing edge of the sync signal in accordance with the situation, it becomes possible to select, during a video period for example, the leading edge not affected by the picture content, or to select the trailing edge during a vertical sync signal period or an equalizing pulse period in which temporal continuity is existent in the trailing edge thereof.

And when the phase of a comparison signal is present within the period ranging from an intermediate point of the horizontal scanning period to the trailing edge of the horizontal sync signal, the output of the error detector means is replaced with a fixed value to thereby realize prevention of mislock and speed up of a pull-in action.

Besides the above, even if temporal discontinuity is existent in the sync signal at a head switching time or upon occurrence of any dropout, a stable operation can still be maintained without detection of a great error value.

What is claimed is:

1. An apparatus for generating a clock signal phase-locked to a sync signal of a digitized video signal, comprising:

error detector means for detecting a phase error between the sync signal of the digitized video signal and a comparison signal produced internally;

clock signal generator means whose oscillation frequency is variably controlled in response to the output of said error detector means;

counter means for counting the output of said clock signal generator means; and window generating means, for generating a window period which encompasses a transition in said sync signal, said window generating means being coupled to said counter means for producing said comparison signal during said window period in response to the count value of said counter means;

wherein said error detector means detects the phase error by integrating the digitized video signal and detects the phase error selectively from the leading edge or the trailing edge of the sync signal.

2. The apparatus according to claim 1, wherein the output of said error detector means is replaced with a fixed value when the comparison signal has a predetermined phase.

3. an apparatus for generating a clock signal phase-locked to a sync signal of a digitized videl signal, comprising:

error detector means for detecting a phase error between the sync signal of the digitized video signal and a comparison signal produced internally by integrating the digitized video signal, wherein said error detector means detects the phase error selectively from the leading edge or the trailing edge of the sync signal, and wherein the output of said error detector means is replaced with a fixed value when the comparison signal has a predetermined phase;

clock signal generator means whose oscillation frequency is variably controlled in response to the output of said error detector means;

counter means for counting the output of said clock signal generator means;

means for producing said comparison signal in response to the count value of said counter means; and wherein, upon detection of discontinuity in the sync signal, the phase error is held and said counter means is reset.

4. An apparatus for generating a clock signal phase-locked to a sync signal of a digitized video signal, comprising:

error detector means for detecting a phase error between the sync signal of the digitized video signal and a comparison signal produced internally;

clock signal generator means whose oscillation frequency is variably controlled in response to the output of said error detector means;

counter means for counting the output of said clock signal generator means; and window generating means, for generating a window period which encompasses a transition in said sync signal, said window generating means being coupled to said counter means for producing said comparison signal during said window period in response to the count value of said counter means;

wherein said error detector means detects the phase error by integrating the digitized video signal; and wherein the output of said error detector means is replaced with a fixed value when the comparison signal has a predetermined phase.

5. An apparatus for generating a clock signal phase-locked to a sync signal of a digitized video signal, comprising:

error detector means for detecting a phase error between the sync signal of the digitized video signal and a comparison signal produced internally by integrating the digitized video signal, wherein the output of said error detector means is replaced with a fixed value when the comparison signal has a predetermined phase;

clock signal generator means whose oscillation frequency is variably controlled in response to the output of said error detector means;

counter means for counting the output of said clock signal generator means;

means for producing said comparison signal in response to the count value of said counter means; and wherein, upon detection of discontinuity in the sync signal, the phase error is held and said counter means is reset.

6. An apparatus for generating a clock signal phase-locked to a sync signal of a digitized video signal, comprising:

error detector means for detecting a phase error between the sync signal of the digitized video signal and a comparison signal produced internally;

clock signal generator means whose oscillation frequency is variably controlled in response to the output of said error detector means;

counter means for counting the output of said clock signal generator means; and window generator means, for generating a window period which encompasses a transition in said sync signal, said window generating means being coupled to said counter means for producing said comparison signal during said window period in response to the count value of said counter means;

wherein said error detector means detects the phase error selectively from the leading edge or the trailing edge of the sync signal.

7. The apparatus according to claim 6, wherein the output of said error detector means is replaced with a fixed value when the comparison signal has a predetermined phase.

8. An apparatus for generating a clock signal phase-locked to a sync signal of a digitized video signal, comprising:

error detector means for detecting a phase error between the sync signal of the digitized video signal and a comparison signal produced internally, wherein said error detector means detects the phase error selectively from the leading edge or the trailing edge of the sync signal, and wherein the output of said error detector means is replaced with a fixed value when the comparison signal has a predetermined phase;

clock signal generator means whose oscillation frequency is variably controlled in response to the output of said error detector means;

counter means for counting the output of said clock signal generator means;

means for producing said comparison signal in response to the count value of said counter means; and wherein, upon detection of discontinuity in the sync signal, the phase error is held and said counter means is reset.

9. An apparatus for generating a clock signal phase-locked to a sync signal of a digitized video signal, comprising:

error detector means for detecting a phase error between the sync signal of the digitized video signal and a comparison signal produced internally;

clock signal generator means whose oscillation frequency is variably controlled in response to the output of said error detector means;

counter means for counting the output of said clock signal generator means; and window generating means, for generating a window period which encompasses a transition in said sync signal, said window generating means being coupled to said counter means for producing said comparison signal during said window period in response to the count value of said counter means;

wherein the output of said error detector means is replaced with a fixed value when the comparison signal has a predetermined phase.

10. An apparatus for generating a clock signal phase-locked to a sync signal of a digitized video signal, comprising:

error detector means for detecting a phase error between the sync signal of the digitized video signal and a comparison signal produced internally, wherein the output of said error detector means is replaced with a fixed value when the comparison signal has a predetermined phase;

clock signal generator means whose oscillation frequency is variably controlled in response to the output of said error detector means;

counter means for counting the output of said clock signal generator means;

means for producing said comparison signal in response to the count value of said counter means; and wherein, upon detection of discontinuity in the sync signal, the phase error is held and said counter means is reset.

11. A method of generating a clock signal phase-locked to a sync signal of a digitized video signal, comprising the steps of:

detecting a phase error between the sync signal of the digitized video signal and a comparison signal produced internally;

generating a clock signal whose frequency is variably controlled in response to the detected phase error;

counting the generated clock signal; and producing said comparison signal during a transition period of said sync signal in response to the counted value of the clock signal;

wherein said phase error is detected by integrating the digitized video signal and is detected selectively from the leading edge or the trailing edge of the sync signal.

12. The method according to claim 11, wherein the detected phase error is replaced with a fixed value when the comparison signal has a predetermined phase.

13. A method of generating a clock signal phase-locked to a sync signal of a digitized video signal, comprising the steps of:

detecting a phase error between the sync signal of the digitized video signal and a comparison signal produced internally by integrating the digitized video signal, wherein the phase error is detected selectively from the leading edge or the trailing edge of the sync signal and wherein the detected phase error is replaced with a fixed value when the comparison signal has a predetermined phase;

generating a clock signal whose frequency is variably controlled in response to the detected phase error;

counting the generated clock signal;

producing said comparison signal during a transition period of said sync signal in response to the counted value of the clock signal; and wherein, upon detection of discontinuity in the sync signal, the phase error is held and the count is cleared.

* * * * *